United States Patent [19]

Hosogane et al.

[11] Patent Number: 5,439,986
[45] Date of Patent: Aug. 8, 1995

[54] THERMO-CURABLE RESIN COMPOSITION, AND A METHOD FOR PRODUCING A COPPER-CLAD LAMINATE USING SAME

[75] Inventors: Tadayuki Hosogane, Yokohama; Hiroshi Nakajima, Sawa; Eiichiro Takiyama, Kamakura, all of Japan

[73] Assignee: Showa Highpolymer Co., Ltd., Tokyo, Japan

[21] Appl. No.: 146,067

[22] PCT Filed: Jul. 30, 1993

[86] PCT No.: PCT/JP93/01074

§ 371 Date: Nov. 16, 1993

§ 102(e) Date: Nov. 16, 1993

[87] PCT Pub. No.: WO94/03517

PCT Pub. Date: Feb. 17, 1994

[30] Foreign Application Priority Data

| | | |
|---|---|---|
| Aug. 3, 1992 [JP] | Japan | 4-206800 |
| Oct. 20, 1992 [JP] | Japan | 4-281933 |
| May 17, 1993 [JP] | Japan | 5-114894 |
| May 17, 1993 [JP] | Japan | 5-114895 |
| May 17, 1993 [JP] | Japan | 5-114896 |

[51] Int. Cl.$^6$ ............ C08F 283/04; C08L 63/00
[52] U.S. Cl. ............ 525/423; 525/426; 525/510; 525/511; 525/529; 525/530; 525/935
[58] Field of Search ............ 525/423, 426, 392, 395, 525/396, 510, 511, 529, 530, 935

[56] References Cited

U.S. PATENT DOCUMENTS

| | | | |
|---|---|---|---|
| 4,374,214 | 2/1983 | Holub et al. | 528/117 |
| 4,496,695 | 1/1985 | Sugio et al. | 525/396 |
| 4,506,042 | 3/1985 | Tsuboi et al. | 525/178 |
| 4,654,407 | 3/1987 | Domeier | 528/322 |
| 4,861,823 | 8/1989 | Qureshi | 528/170 |
| 4,946,908 | 8/1990 | Chu et al. | 525/426 |
| 5,112,924 | 5/1992 | Chu et al. | 525/426 |
| 5,122,589 | 6/1992 | Camberlin et al. | 528/170 |
| 5,189,116 | 2/1993 | Boyd et al. | 525/423 |

FOREIGN PATENT DOCUMENTS

| | | |
|---|---|---|
| 48-93698 | 12/1973 | Japan . |
| 56-59834 | 5/1981 | Japan . |
| 57-2317 | 1/1982 | Japan . |
| 63-500866 | 3/1988 | Japan . |

*Primary Examiner*—Melvyn I. Marquis
*Assistant Examiner*—Randy Gulakowski
*Attorney, Agent, or Firm*—Oblon, Spivak, McClelland, Maier & Neustadt

[57] ABSTRACT

A thermo-curable resin composition which contains (a) an aromatic polyamide oligomer having polymerizable unsaturated group(s) at both terminals or within side chain(s), (b) a maleimide compound and (c) an epoxy resin; and a copper foil laminate which comprises impregnating said composition into substrates, followed by bonding by co-pressing copper foils is provided. The copper-clad laminate of the present invention has excellent adhesiveness to copper foil, heat resistance and electrical properties.

8 Claims, No Drawings

THERMO-CURABLE RESIN COMPOSITION, AND A METHOD FOR PRODUCING A COPPER-CLAD LAMINATE USING SAME

TECHNICAL FIELD

The present invention relates to a thermo-curable resin composition excellent in heat resistance, mechanical strength and processability, and to a method for producing a copper-clad laminate useful as a laminate for electrical circuits by using the composition. In particular, the present invention relates to a thermo-curable resin composition having excellent adhesiveness where the resulting cured molding product has excellent mechanical properties, and to a method for producing a copper-clad laminate having good adhesiveness between a copper foil and a substrate as well as excellent heat resistance and electrical properties, that is useful in electrical, electronics and automotive industries.

BACKGROUND ART

Heretofore, thermo-curable resins having an imide structure have been widely used in industrial fields, due to their excellent physical properties such as electric insulation, heat resistance and an ability to provide the resulting molded products with dimensional stability.

Thermo-curable resins prepared from aromatic bismaleimides are materials which are insoluble and unmeltable, as well as excellent in heat resistance. However, they have some disadvantages such as poor processability, impact resistance and stiffness.

In order to improve impact resistance and stiffness of such aromatic bismaleimide-based resins, there has been proposed a method in which an aromatic diamine is used in combination with the aromatic bismaleimide. For example, a polyaminobis-maleimide resin ("Kynnel"; produced by Rhone Poulenc S. A) composed of N,N'-diphenylmethane bismaleimide and 4,4'-diaminodiphenylmethane is better in impact resistance and stiffness than a resin composed of an aromatic bismaleimide alone, and therefore its molded products have been widely used as structural materials, slider materials, and so on. However, even such thermo-curable resins are far from satisfactory in regards to impact resistance and stiffness.

On the other hand, in general, as printed circuit boards for electrical and electronics systems, paper base phenolic resin laminates in which paper is used as a substrate and glass fabric base epoxy resin laminates in which glass cloth is used as a substrate have been mainly used. However, the increase in heat release value has been a large problem with trends toward increasing packaging density and higher densities of circuit patterns. Therefore, improvement of heat resistance of such substrates has become an important subject.

For the purpose of improving heat resistance, bismaleimide-based resins have been studied as resins for impregnation, in the place of epoxy-based resins. Generally, compared with epoxy resin laminates, bismaleimide-based resin laminates are superior in heat resistance, and therefore have been rewardingly used for multilayer printed circuit boards. However, such laminates have a room for improvement in the adhesiveness of layers.

On the other hand, in case of condensation-type polyimide-based resins, although the expected electrical properties and mechanical properties are excellent, a disadvantage that condensed water given during imidization lowers the adhesiveness and heat stability and generates voids still remains.

In methods for producing copper-clad laminates, in case of copper-clad laminates of phenol resin using paper as a substrate, a phenol resin-based adhesive generally used in a pre-coated form on a copper foil. On the other hand, in case of copper-clad laminates of epoxy resin using a glass cloth as a substrate, a copper foil with no adhesive coating is specially used.

Further, in case of copper-clad laminates of bismaleimide-based resins or condensed-type polyimide-based resins, an epoxy resin-based adhesive is generally used in a pre-coated form on a copper foil.

However, such phenol resin-based and epoxy resin-based adhesives have a defect in that they exhibit poor heat resistance.

Accordingly, the object of the present invention is to provide a thermo-curable resin composition in which strength is not lowered by exposure to high temperatures for a long time and which has excellent electric properties, processability, impact resistance and stiffness, and a method for producing a copper-clad laminate using the composition as an adhesive, as well as a method for producing a copper-clad laminate using the composition as a resin for impregnation, comprising laminating a copper foil with no adhesive coating.

Disclosure of Invention

The present invention provides a thermo-curable resin composition and a method for producing a copper-clad laminate, which can achieve the above objects.

That is, the first aspect of the present invention is to provide a thermo-curable resin composition which contains (a) an aromatic polyamide oligomer having polymerizable unsaturated group(s) at both terminals or within side chain(s), (b) a maleimide compound and (c) an epoxy resin.

The second aspect of the present invention is to provide a thermo-curable resin composition which contains (a) an aromatic polyamide oligomer having polymerizable unsaturated group(s) at both terminals or within side chain(s), (b) a maleimide compound and (c) N,N,N',N'-tetraglycidyl-m-xylenediamine and/or 1,3-bis(N,N-diglycidylaminomethyl)cyclohexane.

The third aspect of the present invention is to provide a thermo-curable resin composition which contains (a) an aromatic polyamide oligomer having polymerizable unsaturated group(s) at both terminals or within side chain(s), (b) a maleimide compound, (c) an epoxy resin or N,N,N',N'-tetraglycidyl-mxylenediamine and/or 1,3-bis(N,N-diglycidylaminomethyl) cyclohexane and (d) carbon fiber.

The fourth aspect of the present invention is to provide a thermo-curable resin composition which contains (a) an aromatic polyamide oligomer having polymerizable unsaturated group(s) at both terminals or within side chain(s), (b) a maleimide compound, (c) an epoxy resin or N,N,N',N'-tetraglycidyl-mxylenediamine and/or 1,3-bis(N,N-diglycidylaminomethyl) cyclohexane and (d) a fused quartz filler.

The fifth aspect of the present invention is to provide a thermo-curable resin composition which contains (a) an aromatic polyamide oligomer having polymerizable unsaturated group(s) at both terminals or within side chain(s), (b) a maleimide compound, (c) an epoxy resin or N,N,N',N'-tetraglycidyl-mxylenediamine and/or 1,3-bis(N,N-diglycidylaminomethyl) cyclohexane and (d) glass fiber.

The sixth aspect of the present invention is to provide a method for producing a copper-clad laminate comprising: laminating a predetermined number of substrates impregnated with (a) an aromatic polyamide oligomer having polymerizable unsaturated group(s) at both terminals or within side chain(s) and (b) a maleimide compound, on which one or both sides are further laminated with a copper foil coated with an adhesive which contains (a) an aromatic polyamide oligomer having polymerizable unsaturated group(s) at both terminals or within side chain(s), (b) a maleimide compound and (c) an epoxy resin.

The seventh aspect of the present invention is to provide a method for producing a copper-clad laminate according to the above method, in which a composition containing (a) an aromatic polyamide oligomer having polymerizable unsaturated group(s) at both terminals or within side chain(s), (b) a maleimide compound and (c) N,N,N',N'-tetraglycidyl-m-xylenediamine and/or 1,3-bis (N,N-diglycidylaminomethyl)cyclohexane is used as an adhesive.

The eighth aspect of the present invention is to provide a method for producing a copper-clad laminate comprising: laminating a predetermined number of substrates on which (a) an aromatic polyamide oligomer having polymerizable unsaturated group(s) at both terminals or within side chain(s), (b) a maleimide compound and (c) an epoxy resin have been impregnated, on which one or both sides are further laminated with a copper foil coated or uncoated with an adhesive.

Further, the ninth aspect of the present invention is to provide a method for producing a copper-clad laminate according to the above method, in which a composition containing (a) an aromatic polyamide oligomer having polymerizable unsaturated group(s) at both terminals or within side chain(s), (b) a maleimide compound and (c) N,N,N',N'-tetraglycidyl-m-xylene-diamine and/or 1,3-bis(N,N-diglycidylaminomethyl) cyclohexane is used as a thermo-curable resin composition to be impregnated on the substrates.

The present invention is constructed as mentioned above. Accordingly, the present invention can provide a laminate remarkably improved in adhesiveness to copper foil, which can be widely used as a laminate useful in the electrical, electronics, automotive industries, and so on.

The present invention will be illustrated in detail as follows.

a. Aromatic Polyamide Oligomer

The aromatic polyamide oligomer having polymerizable unsaturated group(s) at both terminals or within side chain(s), to be used in the present invention, is one synthesized according to a method in which an aromatic diamine, an aliphatic monoamine having terminal unsaturated group(s) and an aromatic dicarboxylic acid dihalide are reacted with one another in the presence of a hydrogen halide acceptor (Japanese Patent Application Laid-open No. 218711-1990); a method in which an aromatic diamine, an aliphatic monoamine having terminal unsaturated group(s) and an aromatic dicarboxylic acid dihalide are reacted with one another in the presence of a hydrogen halide acceptor (Japanese Patent Application Laid-open No. 21636-1991); a method in which an aromatic diamine, an organic acid halide having internal unsaturated group(s) and an aromatic dicarboxylic acid dihalide are reacted with one another in the presence of a hydrogen halide acceptor (Japanese Patent Application Laid-open No. 50219-1991); a method in which an aromatic diamine, an organic acid halide having terminal unsaturated group(s) and an aromatic dicarboxylic acid dihalide are reacted with one another in the presence of a hydrogen halide acceptor (Japanese Patent Application Laid-open No. 50217-1991); a method in which an aromatic diamine, an aromatic dicarboxylic acid dihalide and N-(hydroxyphenyl) cyclic unsaturated imide or N-(hydroxyalkyl) cyclic unsaturated imide are reacted with one another in the presence of a hydrogen halide acceptor (Japanese Patent Application Laid-open No. 277629-1991); a method in which an aromatic diamine, maleimide and an aromatic dicarboxylic acid dihalide are reacted with one another in the presence of a hydrogen halide acceptor (Japanese Patent Application Laid-open No. 185016-1991); a method in which an aromatic diamine, an aromatic dicarboxylic acid dihalide and an unsaturated alcohol or an unsaturated phenol are reacted with one another in the presence of a hydrogen halide acceptor (Japanese Patent Application Laid-open No. 252410-1991); and a method in which an aromatic diamine, (meth) acrylamide and an aromatic dicarboxylic acid dihalide are reacted with one another in the presence of a hydrogen halide acceptor (Japanese Patent Application Laid-open No. 166210-1991).

b. Maleimide Compound

As the maleimide compound to be used by blending with the above aromatic polyamide oligomer in the present invention, there can be employed compounds such as:

(i) phenylmaleimides;
(ii) dimaleimides synthesized from aromatic diamine and maleic anhydride; and
(iii) polymaleimides synthesized from polyamine and maleic anhydride, such as aniline-formaldehyde condensation products. According to the present invention, there can also employed mixtures of (i), (ii) and (iii) above.

The phenylmaleimide to be used has a low melting point and wide range of compatibility with aromatic polyamide oligomers, but it is inferior in heat resistance. Therefore, generally, a dimaleimide synthesized from an aromatic diamine as raw material is preferably used.

Examples of such maleimide compounds include N-phenylmaleimide, N-(orthochlorophenyl)maleimide, N,N'-diphenylmethanebismaleimide, N,N'-diphenyletherbismaleimide, N,N'-paraphenylenebismaleimide, N,N'-(2-methylmethaphenylene) bismaleimide, N,N'-methaphenylenebismaleimide, N,N'-(3,3'-dimethyldiphenylmethane)bismaleimide, N,N'-(3,3'-diphenylsulfone)bismaleimide, an aniline-formaldehyde condensation product, and so on.

The aromatic polyamide oligomer having polymerizable unsaturated group(s) at both terminals or within side chain(s) (including phthalamides such as dialylisophthalamide) exhibits, in general, a low curing rate, and is required to be heated to high temperature for a long time even by using a radical generating agent as a catalyst. In such aromatic polyamide oligomer, the curing rate can be improved by blending with maleimide compound.

In addition, in such case, moldability of the composition blended with the maleimide compound before curing can be improved (that is, the melting point being lowered), and processing at low pressure will become possible.

Furthermore, blending with epoxy resin can improve adhesiveness between copper foil and a cured product as well as moldability of the composition before curing.

(c. Epoxy Resin)

As the epoxy resin to be used in the present invention, there can be employed, for example, bisphenol A-type resins (Epicoat 825, 827, 828, 828XA, 834, 815, 1001, 1002, etc.: produced by Yuka Shell Epoxy Co., Ltd.), brominated bisphenol A-type resins (Epicoat 5050, 5050-T-60, 5051F, 5051H, etc.: produced by Yuka Shell Epoxy Co., Ltd.), bisphenol F-type resins (Epicoat 807, etc.: produced by Yuka Shell Epoxy Co., Ltd.), ortho-cresolnovolak-type resins (EOCN-102S, -103S, -104S, etc.: produced by Nippon Kayaku Co., Ltd.), phenol-novolak-type resins (EPPN-201, etc.: produced by Nippon Kayaku Co., Ltd.; Epicoat 152, 154, etc.: produced by Yuka Shell Epoxy Co., Ltd.), cyclic aliphatic epoxy resins (CY179, 177, etc.: produced by Ciba Geigy, Ltd.; ERL4221, 4299, etc.: produced by UCC Co. Ltd.), glycidyl ester-based resins (Araldyte CY182, 192, etc.: produced by Ciba Geigy, Ltd.; Shodyne 508, etc.: produced by Showa Denko K. K.; Epicton 200, 400, etc.: Dainippon Ink and Chemicals, Inc.), glycidylamine-based resins (tetraglycidyl-diaminodiphenylmethane, N,N,N',N'-tetraglycidyl-m-xylylene-diamine, triglycidyl-para-aminophenol, 1,3-bis(N,N-diglycidylaminomethyl)cyclohexane, etc.), heterocyclic epoxy resins (triglycidylisocyanate, 1,3-diglycidyl-hydantoin, etc.). They may be used singly or in a mixtures of two or more.

Among them, bisphenol A-type resins and glycidylaminebased resins are preferable, and glycidylamine-based resins are more preferable. As the glycidylamine-based resins, N,N,N',N'-tetraglycidyl-m-xylenediamine and 1,3-bis(N,N-diglycidylaminomethyl) are especially preferable.

Radical Generation Catalyst

In the present invention, it is preferable to add a radical generation catalyst to the composition. The radical generation catalyst to be used is not particularly limited. However, if the molding temperature is or more, a so-called high temperature-decomposition type radical generation catalyst should be used, such as dicumylperoxide, t-butylperbenzoate, t-butylperoxyisopropyl-carbonate, t-butylperoxyoctoate, etc. The use amount of the radical generation catalyst is preferably within the range from 0 to 3 phr.

Blending Ratio

In the blending ratio between component (a), i.e., an aromatic polyamide oligomer having polymerizable unsaturated group(s) at both terminals or within the side chain(s), component (b), i.e., a maleimide compound and component (c), i.e., an epoxy resin, component (a) to be blended is 2 to 60 parts by weight, preferably 20 to 50 parts by weight, and more preferably 30 to 45 parts by weight; component (b) to be blended is 2 to 70 parts by weight, preferably 20 to 50 parts by weight, and more preferably 30 to 50 parts by weight; and component (c) to be blended is 2 to 96 parts by weight, preferably 5 to 60 parts by weight, and more preferably 10 to 50 parts by weight, each based on 100 parts by weight of the total amount of the composition. In this case, the blending ratio between (a) and (b) components is preferably 6:4 to 3:7 by weight, with 6:4 to 4:6 by weight being especially preferable.

In the blending ratio, if both component (a) and component (b) are less than 2 parts by weight, heat resistance may be impaired although adhesiveness is good. On the other hand, component (a) is over 60 parts by weight and component (b) is over 70 parts by weight, although heat resistance is good, adhesiveness may not reach a satisfactory level.

Less than 2 parts by weight of component (c) in the blending ratio gives poor adhesiveness with copper foil, whereas over 96 parts by weight of component (c) gives poor heat resistance.

It is preferable that the blending ratio between component (a) and component (b) be 6:4 to 3:7 by weight. In this case, if component (a) is over 6 by weight, not only crosslinking density but also physical heat resistance may lower. On the other hand, if component (b) is over 7 by weight, although crosslinking density rises and physical heat resistance is improved, the resulting cured product may be fragile.

Solvent

Generally, a composition containing the components (a), (b) and (c) of the present invention is used as a solution in which the components are dissolved a solvent or monomer which can dissolve them.

As such solvents and monomers, those which can dissolve components (a) and (b) to prepare a solution containing them can be used.

As suitable solvents, for example, for dissolving mixtures of aromatic polyamide oligomer, maleimide compound and epoxy resin, there can be employed N,N-dimethylformamide, N,N-dimethylacetoamide, N-methylpyrrolidone, and so on.

As suitable monomers for dissolving mixtures of aromatic polyamide oligomer, maleimide compound and epoxy resin, N-vinylpyrrolidone, for example, can be employed.

Solutions containing an aromatic polyamide oligomer, a maleimide compound and an epoxy resin may be blended with known compounds, if necessary, such as hydroquinone, benzoquinone, copper salts, tetramethylthiuram compounds, nitrophenylhydroxy compounds, for the purpose of controlling the curability and stability of the resin.

Substrate

The substrate to be used in the copper-clad laminate of the present invention may be a glass cloth for general use, but is preferably a glass cloth of E-glass (i.e., non-alkali glass) having about 20 g/m$^2$ to 250 g/m$^2$ of weight, which surface is treated with a silane-based coupling agent, from the viewpoints of electric insulation, hygroscopicity, workability, adhesiveness, and so on. The content of the substrate in the laminate is preferably 40 to 70% by weight, from the viewpoints of strength and moldability.

The substrate to be used in the present invention may be cloth prepared from other inorganic and organic fibers. In general, the substrate to be used in the present invention has a sheet-like or belt-like form.

Production of the Laminate

The copper foil to be used in the present invention is one which is generally used in laminates for electric circuits, such as electrolysis copper foil, rolled copper foil, and the like. In production of laminates using such copper foil, the copper foil with or without an adhesive coating can be used.

Cases in Which Adhesive is Coated on Copper Foil

The adhesive to be used in this case is a thermo-curable resin composition consisting of component (a), i.e., an aromatic polyamide oligomer having polymerizable unsaturated group(s) at both terminals or within side chain(s), component (b), i.e., a maleimide compound and component (c), i.e., an epoxy resin. The adhesive is preferably added with a radical generation catalyst. The coating of adhesive on the copper foil can be carried out by means of a general roll coater method, and the like. The adhesive-coated copper foil is preferably treated under heating such that it retains a slightly sticky touch.

On the other hand, the substrate to be used in the present invention is treated by impregnation with a solution which contains a thermo-curable resin composition consisting of component (a), i.e., an aromatic polyamide oligomer having polymerizable unsaturated group(s) at both terminals or within side chain(s) and (b) component, i.e., a maleimide compound, or optionally further consisting of component (c), i.e., an epoxy resin. The solution for impregnation is preferably added with a radical generation catalyst. The method for impregnating the substrate with the solution is not particularly limited, as long as the solution is uniformly impregnated to the substrate. In general, the impregnated substrate is then passed through a hot air-type drier oven for a predetermined time and dried for practical use.

The required number of these dried substrates are laminated depending on the desired thickness, while the above adhesive-coated copper foils are laminated on one or both sides of the substrates, followed by pressing under heating to give a copper-clad laminate.

Cases in Which Adhesive is Not coated on Copper Foil

In this case, the thermo-curable resin composition for impregnation to the substrate should contain all of (a) an aromatic polyamide oligomer having polymerizable unsaturated group(s) at both terminals or within side chain(s), (b) a maleimide compound and (c) an epoxy resin. Needless to say the composition also preferably contains a radical generation catalyst. The impregnation to the substrate and the lamination of the copper foils are carried out in the same manner as in the above procedures, to give a copper-clad laminate.

Filler-containing Resin Composition for Molding

The thermo-curable resin composition of the present invention, which contains (a) an aromatic polyamide oligomer having polymerizable unsaturated group(s) at both terminals or within side chain(s), (b) a maleimide compound and (c) an epoxy resin, may further contain carbon fiber, fused quartz filler, glass fiber, and the like, to give a thermo-curable resin composition which exhibits an excellent moldability and which can provide a molding product excellent in mechanical properties by curing.

Carbon Fiber-containing Resin Composition

The carbon fiber to be used in the thermo-curable resin composition of the present invention is fiber exhibiting high elasticity and high strength, which is prepared by carbonization of polyacrylnitrile or petroleum pitch as a main raw material. In the present invention, both polyacrylnitrile-based and petroleum pitch-based carbon fibers can be used. The carbon fiber to be used should have adequate diameter and aspect ratio (i.e., length/diameter ratio), from the viewpoints of reinforcing effect and blendability. The diameter of the carbon fiber is generally about 5 to 20 μm, and preferably about 8 to 15 μm in particular. The aspect ratio is about 1 to 600, and especially preferably about 5 to 350 from the viewpoints of blendability and reinforcing effect. Too small an aspect ratio gives small reinforcing effect, whereas too large an aspect ratio gives bad blendability, resulting in poor molded products. In the present invention, carbon fiber surface treated with various treating agents, such as epoxy resins, polyamide resins, polycarbonate resins, polyacetal resins, or other known surface treating agents depending on the required purposes can also be used.

In the present invention, the content of carbon fiber to be used is within the range of from ]0 to 200 parts by weight, and preferably 20 to ]50 parts by weight, based on 100 parts by weight of the substrate resin [(a), (b) and (c)]. If the content is less than ]0 parts by weight, the reinforcing effect inherent in carbon fiber, which is one of characteristics of the present invention, may not be imparted. On the other hand, if the content is over 200 parts by weight, the fluidity of the composition may become bad at molding, making it difficult to prepare satisfactory molded product.

Fused Quartz Filler-containing Resin Composition

The fused quartz to be used in the resin composition of the present invention is one which is quartz-glassed (i.e., made amorphous) by completely fusing the quartz having a grain size of 2 to 50 μm. The fused quartz may be treated with silane coupling agents such as aminosilane, epoxy silane, etc., and chromic chloride in order to give affinity with the substrate resin, or treated with other surface treating agents depending on the required purposes.

In the present invention, the content of the fused quartz to be used is within the range of from 10 to 300 parts by weight, and preferably within the range of from 20 to 250 parts by weight, based on 100 parts by weight of the substrate resin [(a), (b) and (c)]. Less than 10 parts by weight of the content can not impart the reinforcing effect inherent in the fused silica, which is one of the characteristics of the present invention, whereas over 300 parts by weight of the content makes the fluidity of the composition bad at molding, making it difficult to prepare satisfactory molded product.

Glass Fiber-containing Resin Composition

The glass fiber to be used in the glass fiber-containing thermo-curable resin composition of the present invention is one which is prepared by cooling the fused glass rapidly while drawing according to various methods to give fine fibers having a predetermined diameter and it means strands prepared by binding filaments with one another using a binder, and rovings prepared by arranging the strands uniformly while drawing to give a bundle. In the present invention, both types of glass fiber above can be used. The glass fiber may be treated with silane coupling agents such as aminosilane, epoxy silane, etc., and chromic chloride, in order to give affinity with the substrate resin of the present invention, or treated with other surface treating agents depending on the required purposes.

In the present invention, the length of the glass fiber largely influences the physical properties of the resulting molded product and workability during production of the molded product. In general, by increasing the glass fiber length, the physical properties of the molded product are improved further, whereas the workability during production of the molding product becomes worse. Accordingly, in the present invention, glass fiber having a length of within the range of 0.1 to 6 mm, and preferably within the range of 0.1 to 4 mm is used, from the viewpoint of balancing the physical properties of the molding product and workability.

In the present invention, the content of the glass fiber to be used is within the range of from ]0 to 300 parts by weight, and preferably 20 to 250 parts by weight, based on parts by weight of the substrate resin [(a), (b) and (c)]. Less than ]0 parts by weight of the content can not impart a reinforcing effect, which is one of the characteristics of the present invention, whereas over 300 parts by weight of the content makes the fluidity of the composition bad at molding, making it difficult to prepare satisfactory molded product.

BEST MODE FOR CARRYING OUT OF THE INVENTION

The present invention will be further illustrated in more detail by the following examples. In the examples, all "part(s)" and "%" used are based on weight, unless otherwise stated.

Synthesis Example 1

Synthesis of aromatic polyamide oligomer [I] shown in the following general formula (I):

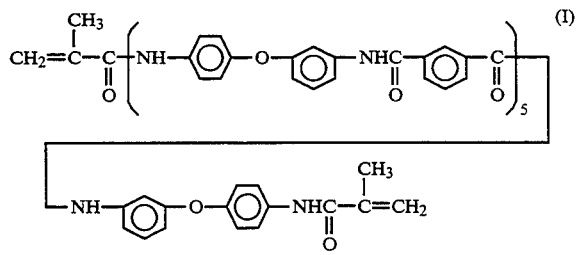

Into a 1 liter-separable flask with four openings, equipped with a reflux condenser, a dropping funnel, a thermometer and a stirrer, 16.92 g (0.083 mole) of isophthalic acid dichloride and 100 g of N,N-dimethylformamide (DMF) were charged, and the reaction mixture was cooled to below 10° C.

Next, 20 g (0.1 mole) of 3,4'-diaminodiphenyl ether (3,4'-DAPE), 20.2 g (0.2 mole) of triethylamine and 75 g of DMF were weighed and mixed with one another, and the mixture was added to the separable flask dropwise. Subsequently, 3.483 g (0.033 mole) of methacrylic acid chloride and. 25 g of DMF were weighed and mixed with one another, and the mixture was further added to the separable flask dropwise. During the procedures, the temperature of the reaction mixture was maintained below 10° C. After adding dropwise, the reaction mixture was stirred for 2 hours while maintaining the temperature below 10° C.

Next, the reaction mixture was gradually poured into a large amount of water under vigorous stirring to precipitate crystals. The resulting crystals were filtered by suction, washed with water, and dried, to give a product having a melting point of 145° to 160° C.

Synthesis Example 2

Synthesis of aromatic polyamide oligomer [II] shown in the following general formula (II):

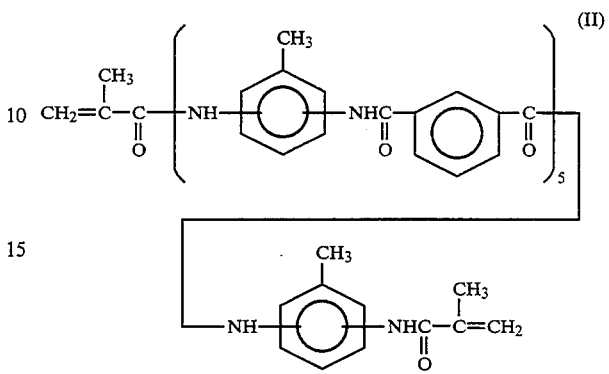

Into a 500 ml-separable flask equipped with a stirrer, a thermometer, a reflux condenser and a nitrogen-introduction tube, 16.6 g of isophthalic acid, 3.44 g of methacrylic acid, 20.88 g of tolylene-2,4-diisocyanate/tolylene-2,6-diisocyanate (80/20), 200 g of DMF and 0.01 g of toluquinone were charged, and nitrogen gas was passed through the reaction mixture with stirring, while heating gradually to 110° C.

After heating, the reaction was maintained at 110° C. for 1 hour. Next, the reaction mixture was further heated to 145° C. After reacting for 5 hours, the reaction mixture was cooled to room temperature. When the resulting polymer solution was measured for infrared absorption spectrum, no absorption by NCO functional group was observed. The polymer solution was gradually poured into a large amount of water under vigorous stirring to precipitate crystals. Subsequently, the resulting crystals were filtered by suction, washed with water, and dried, to give a product having a melting point of 210° to 250° C.

Example 1

A mixture of 50 parts of aromatic polyamide oligomer [I] prepared in Synthesis Example 1, 50 parts of N,N'-diphenylmethane bismaleimide and 100 parts of N-methylpyrrolidone was stirred with heating to 80° C. to give a homogeneous solution. The resulting solution was cooled to 60° C., and 2 parts of dicumylperoxide was added thereto, to prepare a solution for impregnation.

After impregnating the solution for impregnation into glass cloth WE 05E 104 (Nittobo Co., Ltd.), the resultant was dried at 100° C. for 1 hour to give a prepreg.

On the other hand, 100 parts of Epicoat 827 (Yuka Shell Epoxy Co., Ltd.), 55 parts of aromatic polyamide oligomer [I], 55 parts of N,N'-diphenylmethane bismaleimide, 2.2 parts of dicumylperoxide and 200 parts of DMF were mixed by stirring to give an adhesive. Next, the adhesive was coated on a copper foil (3EC/-produced by Mitsui Mining & Smelling Co., Ltd.) having a 35 μm thickness, and dried at 80° C. for 1 hour, to give copper foil with adhesive.

Copper foils with adhesive were put on both sides of 30 plys of the prepregs layered with one another, this was molded under heating and pressure (20 kg/cm²) at 180° C. for 1 hour, and subsequently treated under heating at 150° C. for 5 hours, to give a copper-clad laminate having a thickness of 1.6 mm.

The peeling strength of the copper foil (at 23° C.) was 5.6 kg/2.5 cm.

Comparative Example 1

Copper foils without adhesive having a thickness of 35 μm (3EC / produced by Mitsui Mining & Smelling Co., Ltd.) were put on both sides of 30 plys of the prepregs prepared in Example 1 layered with one another, and this was molded under heating and pressure (20 kg/cm$^2$) at 180° C. for 1 hour to give a copper-clad laminate having a thickness of 1.6 mm.

The peeling strength (at 23° C.) was 2.4 kg/2.5 cm.

Example 2

A mixture of 11.25 parts of aromatic polyamide oligomer [I] prepared in Synthesis Example 1, 11.25 parts of N,N'-diphenylmethane bismaleimide, 22.5 parts of N,N,N',N'-tetraglycidyl-m-xylenediamine and 55 parts of N,N-dimethylformamide was stirred with heating to 80° C. to give a homogeneous solution.

The resulting solution was cooled to 60° C., and 0.45 part of dicumylperoxide was added thereto, to prepare a solution for impregnation.

After impregnating the solution for impregnation into glass cloth WE 05E ]104 (Nittobo Co., Ltd.), the resultant was dried at 80° C. for 1 hour to give a prepreg.

Copper foils (3EC / produced by Mitsui Mining & Smeling Co., Ltd.) having a 35 μm of thickness were put on both sides of 30 plys of the prepregs layered with one another, and this was molded under heating and pressure (20 kg/cm$^2$) at 180° C. for 1 hour, and subsequently treated under heating at 150° C. for 5 hours, to give a copper-clad laminate having a thickness of 1.6 mm.

The peeling strength of the copper foil (at 23° C.) was 4.3 kg/2.5 cm.

Example 3

A mixture of 20 parts of aromatic polyamide [II] prepared in Synthesis Example 2, 20 parts of N,N'-diphenylmethane bismaleimide, 5 parts of N,N,N',N'-tetraglycidyl-m-xylenediamine and 55 parts of N,N-dimethylformamide was stirred with heating to 80° C. to give a homogeneous solution.

The resulting solution was cooled to 60° C., and 0.8 part of dicumylperoxide was added thereto, to prepare a solution for impregnation.

After impregnating the solution for impregnation into glass cloth WE 05E 104 (Nittobo Co., Ltd.), the resultant was dried at 80° C. for 1 hour to give a prepreg.

Copper foils (3EC / produced by Mitsui Mining & Smelling Co., Ltd.) having a 35 μm thickness were put on both sides of 30 plys of the prepregs layered with one another, and this was molded under heating and pressure (20 kg/cm$^2$) at 180° C. for 1 hour, and subsequently treated under heating at 150° C. for 5 hours, to give a copper-clad laminate having a thickness of 1.6 mm.

The peeling strength of the copper foil (at 23) was 4.3 kg/2.5 cm.

Example 4

A mixture of 50 parts of aromatic polyamide oligomer [II] prepared in Synthesis Example 2, 50 parts of N,N'-diphenylmethane bismaleimide and 100 parts of N-methylpyrrolidone was stirred with heating to 80° C. to give a homogeneous solution. The resulting solution was cooled to 60° C., and 2 parts of dicumylperoxide was added thereto, to prepare a solution for impregnation. After impregnating the solution for impregnation to glass cloth WE 05E 104 (Nittobo Co., Ltd.), the resultant was dried at 100° C. for 1 hour to give a prepreg.

On the other hand, 10 parts of N,N,N',N'-tetraglycidyl-m-xylenediamine, 17.5 parts of aromatic polyamide oligomer [II], 17.5 parts of N,N'-diphenylmethane bismaleimide, 0.7 part of dicumylperoxide and 55 parts of DMF were mixed by stirring to give an adhesive. Next, the adhesive was coated on a copper foil (3EC / produced by Mitsui Mining & Smeling Co., Ltd.) having a 35 μm of thickness, and dried at 80° C. for 1 hour, to give a copper foil with adhesive.

Copper foils with adhesive were put on both sides of 30 plys of the prepregs layered with one another, and this was molded under heating and pressure (20 kg/cm$^2$) at 180° C. for 1 hour, and subsequently treated under heating at 150° C. for 5 hours, to give a copper-clad laminate having a thickness of 1.6 mm.

The peeling strength of the copper foil (at 23° C.) was 4.7 kg/2.5 cm.

Example 5

39 parts of aromatic polyamide oligomer [II] prepared in Synthesis Example 2, 39 parts of N,N'-diphenylmethane bismaleimide, 22 parts of N,N,N',N'-tetraglycidyl-m-xylenediamine, 3 parts of zinc stearate, 200 parts of fused quartz (Fuselex RD-8: produced by Ryushin K. K.), 2 parts of dicumylperoxide and 0.05 part of hydroquinone were weighed and mixed by stirring to give a homogeneous mixture.

The above mixture was kneaded for 12 min. using a heating roll heated to 120° C., to give a sheet-like homogeneous composition. After cooling, the resulting sheet-like homogeneous composition was shattered into pieces, and molded under pressure under the following conditions to measure its bending strength:

Molding conditions:
pre-heating: at 80° C. for 30 min.;
molding temperature: 160° C.;
molding time: for 20 min.;
molding pressure: 50 kg/cm$^2$;
post-curing: at 180° C. for 5 hours;
Bending strength:
before post-curing: 7.9 kg/mm$^2$;
after post-curing: 9.6 kg/mm$^2$;
Bending elastic modulus:
before post-curing: 1290 kg/mm$^2$;
after post-curing: 1570 kg/mm$^2$.

Example 6

The procedure was carried out in the same manner as Example 5, except that 33.4 parts of aromatic polyamide oligomer [I] prepared in Synthesis Example 1, 33.3 parts of N,N'-diphenylmethane bismaleimide, 33.3 parts of N,N,N',N'-tetra-glycidyl-m-xylenediamine, 3 parts of zinc stearate, 200 parts of fused silica, 2 parts of dicumylperoxide and 0.05 part of hydroquinone were used.

Bending strength:
before post-curing: 6.8 kg/mm$^2$;
after post-curing: 9.6 kg/mm$^2$;
Bending elastic modulus:
before post-curing: 1230 kg/mm$^2$;
after post-curing: 1540 kg/mm$^2$.

Example 7

39 parts of aromatic polyamide oligomer [II] prepared in Synthesis Example 2, 39 parts of N,N'-diphenylmethane bismaleimide, 22 parts of N,N,N',N'-tetraglycidyl-m-xylenediamine, 3 parts of zinc stearate, 200 parts of glass powder (EPG140M-80A; produced by Nippon Electric Glass Co., Ltd.), 2 parts of dicumylperoxide and 0.05 part of hydroquinone were weighed and mixed by stirring to give a homogeneous mixture.

The above mixture was kneaded for 12 min. using a heating roll heated to 120° C., to give a sheet-like homogeneous composition. After cooling, the resulting sheet-like homogeneous composition was shattered into pieces, and molded under pressure under the following conditions to measure its bending strength:

Molding conditions:
pre-heating: at 80° C. for 30 min.;
molding temperature: 160° C.;
molding time: for 20 min.;
molding pressure: 50 kg/cm$^2$;
post-curing: at 180° C. for 5 hours;
Bending strength:
before post-curing: 11.0 kg/mm$^2$;
after post-curing: 15.5 kg/mm$^2$;
Bending elastic modulus:
before post-curing: 1470 kg/mm$^2$;
after post-curing: 1460 kg/mm$^2$.

Example 8

The procedure was carried out in the same manner as Example 7, except that 150 parts of glass powder was used instead of 200 parts.
Bending strength:
before post-curing: 13.6 kg/mm$^2$;
after post-curing: 15.0 kg/mm$^2$;
Bending elastic modulus:
before post-curing: 1320 kg/mm$^2$;
after post-curing: 1290 kg/mm$^2$.

Example 9

The procedure was carried out in the same manner as Example 7, except that ]00 parts of glass powder was used instead of 200 parts.
Bending strength:
before post-curing: 11.8 kg/mm$^2$;
after post-curing: 11.2 kg/mm$^2$;
Bending elastic modulus:
before post-curing: 1060 kg/mm$^2$;
after post-curing: 1160 kg/mm$^2$.

Example ]

39 parts of aromatic polyamide oligomer [I] prepared in Synthesis Example 1, 39 parts of N,N'-diphenylmethane bismaleimide, 22 parts of N,N,N',N'-tetraglycidyl-m-xylenediamine, 3 parts of zinc stearate, 100 parts of carbon fiber (MLD100; produced by Toray Industries, Inc.), 2 parts of dicumylperoxide and 0.05 part of hydroquinone were weighed and mixed by stirring to give a homogeneous mixture.

The above mixture was kneaded for 12 min. using a heating roll heated to 120° C., to give a sheet-like homogeneous composition. After cooling, the resulting sheet-like homogeneous composition was shattered into pieces, and molded under pressure under the following conditions to measure its bending strength:

Molding conditions:
pre-heating: at 80° C. for 30 min.;
molding temperature: 160° C.;
molding time: for 20 min.;
molding pressure: 50 kg/cm$^2$;
post-curing: at 180° C. for 5 hours;
Bending strength:
before post-curing: 12.0 kg/mm$^2$;
after post-curing: 16.3 kg/mm$^2$;
Bending elastic modulus:
before post-curing: 1190 kg/mm$^2$;
after post-curing: 1150 kg/mm$^2$.

The thermo-curable resin composition according to the present invention may be further blended with hydroquinone, benzoquinone, copper salts, tetramethylthiuram compounds, nitrophenylhydroxy compounds, and other known compounds, as required, in order to control the curing properties and stability of the resin.

In addition, the thermo-curable resin composition of the present invention may also have added one or more conventional additives such as antioxidants, heat stabilizers, UV absorbents, antistatic agents, lubricants, coloring agents, and so on, within the range that does not impair the objects of the present invention.

Furthermore, the composition of the thermo-curable resin composition of the present invention may also have added reinforcing agents such as glass fiber, aromatic polyamide fiber, alumina fiber, potassium titanate fiber, and so on, and fillers such as clay, mica, graphite, glass beads, alumina fused silica, and so on, in an adequate amount depending on the required purposes.

Industrial Applicapability

The thermo-curable resin composition of the present invention can be molded by known molding methods such as pressure molding, transfer molding, extrusion molding, injection molding, and the like, and can be subjected to practical use. By laminating copper foils with other substrates using such thermo-curable resin composition, there can be provided a laminate which exhibits remarkably improved adhesiveness and which is useful for electrical, electronics and automotive industries, etc.

We claim:

1. A thermo-curable resin composition which contains:
   (a) an aromatic polyamide oligomer having polymerizable unsaturated group(s) at both terminals or within side chain(s);
   (b) a maleimide compound; and
   (c) an epoxy resin.

2. A composition according to claim 1, in which said epoxy resin (c) is N,N,N',N'-tetraglycidyl-m-xylenediamine and/or 1,3-bis(N,N-diglycidylaminomethyl)cyclohexane.

3. A thermo-curable resin composition in which (d) carbon fiber is further contained in the composition according to claim 1.

4. A thermo-curable resin composition in which (e) a fused quartz filler is further contained in the composition according to claim 1.

5. A thermo-curable resin composition in which (f) glass fiber is further contained in the composition according to claim 1.

6. A thermo-curable resin composition according to any one of claims 1 to 5, which is characterized in further containing a radical generation catalyst.

7. A thermo-curable resin composition according to any one of claims 1 to 5, which consists of:

2 to 60 parts by weight of (a) an aromatic polyamide oligomer having polymerizable unsaturated group(s) at both terminals or within side chain(s);

2 to 70 parts by weight of (b) a maleimide compound; and 2 to 96 parts by weight of (c) an epoxy resin, based on 100 parts by weight of the total amounts of the thermocurable resin composition.

8. A thermo-curable resin composition according to any one of claims 1 to 5, which consists of:

20 to 50 parts by weight of (a) an aromatic polyamide oligomer having polymerizable unsaturated group(s) at both terminals or within side chain(s);

20 to 50 parts by weight of (b) a maleimide compound; and 5 to 60 parts by weight of (c) an epoxy resin, based on 100 parts by weight of the total amounts of the thermocurable resin composition.

* * * * *